United States Patent
Lim et al.

(10) Patent No.: US 8,325,002 B2
(45) Date of Patent: Dec. 4, 2012

(54) POWER INDUCTOR STRUCTURE

(75) Inventors: Sungmook Lim, Kyunggi-Do (KR);
Yunjae Chong, Kyunggi-Do (KR);
Sungmo Kang, Kyunggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 162 days.

(21) Appl. No.: 12/788,661

(22) Filed: May 27, 2010

(65) Prior Publication Data

US 2011/0291785 A1   Dec. 1, 2011

(51) Int. Cl.
*H01F 5/00* (2006.01)
*H01F 17/00* (2006.01)
*H01F 27/24* (2006.01)
*H01F 17/04* (2006.01)

(52) U.S. Cl. ........ 336/200; 336/177; 336/219; 336/221; 336/234

(58) Field of Classification Search .................. 366/177, 366/200, 219, 221, 234
See application file for complete search history.

(56) References Cited

U.S. PATENT DOCUMENTS

| | | | |
|---|---|---|---|
| 4,103,267 A * | 7/1978 | Olschewski | 336/65 |
| 5,191,699 A * | 3/1993 | Ganslmeier et al. | 29/602.1 |
| 5,959,846 A * | 9/1999 | Noguchi et al. | 361/782 |
| 2004/0124961 A1* | 7/2004 | Aoyagi | 336/200 |
| 2005/0088269 A1* | 4/2005 | Hatano | 336/200 |
| 2005/0122198 A1* | 6/2005 | Zhou et al. | 336/200 |
| 2009/0134503 A1 | 5/2009 | Feng et al. | 257/673 |

FOREIGN PATENT DOCUMENTS

CN   101752054 A   6/2010

OTHER PUBLICATIONS

Chinese First Examination Report of China Counterpart Application No. 201010297904.7, issued on Nov. 3, 2011, p.1-4, in which the listed references were cited.

* cited by examiner

*Primary Examiner* — Mohamad Musleh
*Assistant Examiner* — Tsz Chan
(74) *Attorney, Agent, or Firm* — J.C. Patents (57) ABSTRACT

A variety of power inductor structures are obtained by arranging a magnetic material block between a plurality of wires and a plurality of bond fingers or bond finger pairs. The power inductor structure can provide high inductance and high currents and at the same time afford smaller sizes.

13 Claims, 6 Drawing Sheets

POWER INDUCTOR STRUCTURE

BACKGROUND OF THE INVENTION

1. Field of the Invention

The present invention relates to an inductor structure, and more particularly to a power inductor structure.

2. Description of Related Art

In general, power inductors function by taking energy from the electrical circuit, storing the energy in a magnetic field and returning this energy to the electrical circuit. For electronic products, power inductors are frequently used as DC-to-DC converters or applied in power management circuits.

However, common surface mount type (SMT) power inductors are not suitable to be designed as parts of the package modules because these SMT power inductors are huge in sizes and expensive in costs. On the other hand, RF chip inductors may be compact in sizes but these inductors can not provide high inductance or endure large currents as required.

Hence, it is desirable to develop power inductors with smaller sizes, lower costs, high inductance and required current capability at the same time.

SUMMARY OF THE INVENTION

In view of the foregoing, the present invention provides a power inductor structure, which offers high inductance and high currents. The power inductor structure of the present invention also affords smaller package sizes at lower fabrication costs.

The present invention is directed to a power inductor structure including a package substrate having a metal layer disposed thereon, a magnetic material block and a plurality of wires. The metal layer includes a plurality of individual bond fingers and each bond finger consists of two separate widen portions and a connecting portion located between the two widen portions. The magnetic material block is located on the package substrate, above the connecting portions and between the widen portions, while the plurality of wires, located over the package substrate and across the magnetic material block, electrically connects the plurality of the bond fingers.

The present invention further provides a power inductor structure. The power inductor structure includes a package substrate having a first metal layer and a second metal layer respectively disposed on a two opposite surfaces of the package substrate, a plurality of conductive vias located within the package substrate, a magnetic material block located on the package substrate and a plurality of wires. The first metal layer comprises a plurality of bond finger pairs, while the second metal layer comprises a plurality of conductive lines. Each bond finger pair consists of two separate widen portions, and the two widen portions of each bond finger pair is electrically connected through the conductive vias and one conductive line. The plurality of wires, located over the package substrate and across the magnetic material block, electrically connects the plurality of the bond finger pairs.

According to embodiments of the present invention, a dielectric core of the package substrate includes a slot located beside the magnetic material block and between the widen portions and the magnetic material block.

According to embodiments of the present invention, the slot can be ring-shaped and surround the magnetic material block.

According to embodiments of the present invention, a dielectric core of the package substrate may include a trench and the magnetic material block is disposed within the trench of the dielectric core. The magnetic material block is protruded from the trench and is higher than a top surface of the package substrate.

According to embodiments of the present invention, the power inductor structure may further include two adhesive layers respectively disposed on both opposite surfaces of the magnetic material block to enhance the adhesion.

In order to the make the aforementioned and other objects, features and advantages of the present invention comprehensible, several embodiments accompanied with figures are described in detail below.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

The inductor structures or related modifications described in the present invention can be applied for general types or high frequency package modules. As described hereinafter, the embedded inductor structures refer to the inductor structures at least partially embedded or set in the wiring board or printed circuit board of the package modules. However, certain embodiments of the power inductor structures may be configured to be exactly on the package substrate or the wiring board, and are nonetheless included within the scope of this invention.

The inductor structures as described in the present invention take advantages of the wire-bonding technology, and the applied materials are compatible with the currently used packaging materials. Hence, the fabrication costs of the power inductor structures according to the present invention are lower, when compared with the conventional power inductors.

Figure 1A:
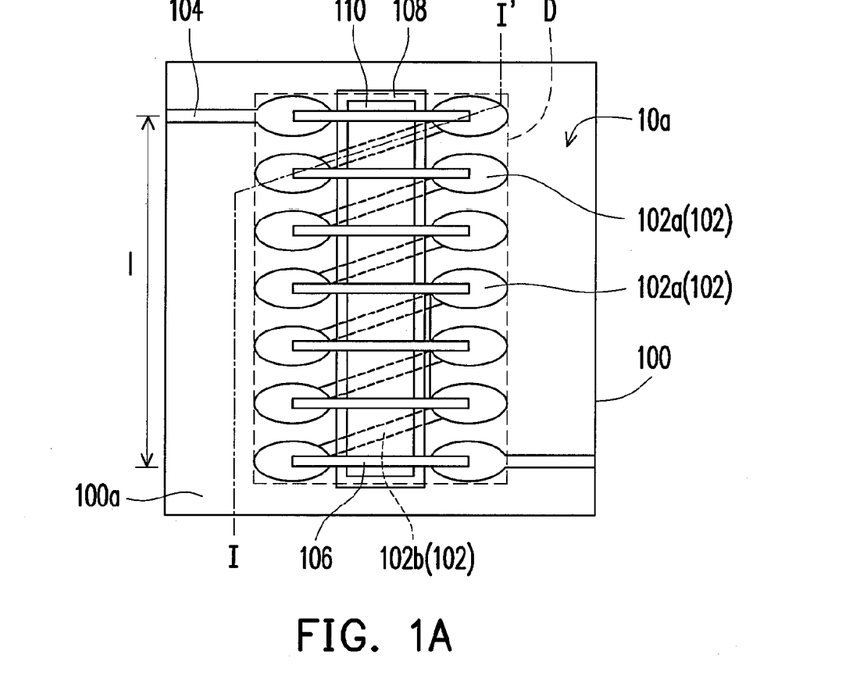
FIG. 1A is a schematic top view showing a power conductor structure according to the first embodiment of the present invention.
Figure 1B:
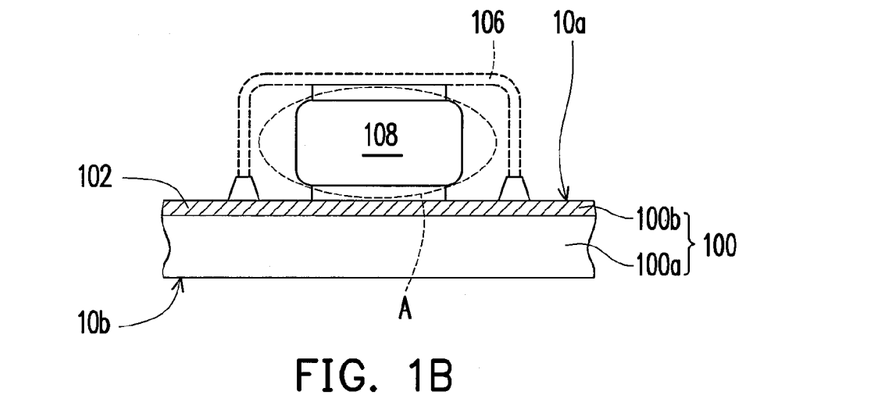
FIG. 1B is a schematic cross-sectional view showing the power conductor structure of FIG. 1A.

FIG. 1A is a schematic top view showing a power conductor structure according to one embodiment of the present invention. FIG. 1B is a schematic cross-sectional view along line I-I' showing the power conductor structure of FIG. 1A.

Figure 1C:
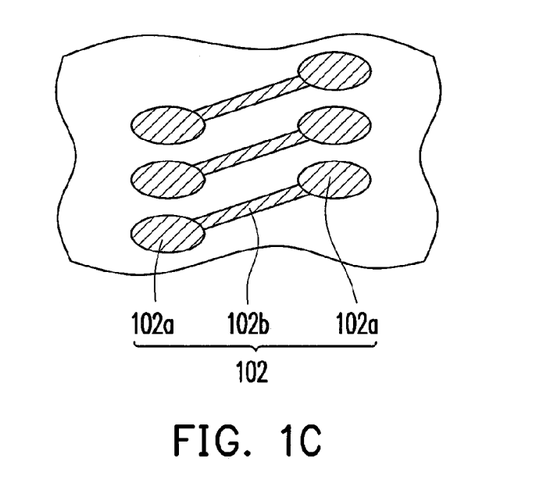
FIG. 1C is an example showing the arrangement of the bond fingers of the power conductor structure.

According to the embodiments of this invention, the package substrate 100 can be a wiring board, such as two-layered or four-layered printed circuit board (PCB), or a laminate board. In FIG. 1A, the package substrate 100 is a two-layered PCB having at least a top metal layer 100b disposed on the dielectric layer 100a. The top surface 10a of the package substrate 100 having a plurality of bond fingers 102, arranged in parallel and physically separate from one another. Depending on the design requirements, the number of the bond fingers 102 is N, where N is a positive integer, larger than three. Each bond finger 102 consists of two widen portions 102a located at two sides and a connecting portion 102b located in-between and connecting the two widen portions 102a. FIG. 1C is an example showing the arrangement of the bond fingers 102. However, the shape and arrangement of the bond fingers 102 are not limited by the example provided herein and may be modified based on the considerations of compactness and electrical properties. In addition to the bond fingers 102, connection traces 104 can be arranged beside the most peripheral bond fingers 102 for electrical connection to external circuits or components. The bond fingers 102 and the connection traces 104 can be fabricated by patterning the top metal layer 100b of the package substrate 100. The material of the top metal layer 100b can be copper, for example.

Taking advantages of the wire-bonding process of the packaging processes, a plurality of wires 106 are formed between the bond fingers 102 as well as between the bond fingers 102 and the connection traces 104, as shown in FIG. 1A. The material of the wire 106 can be copper, for example. Besides connecting the connection traces 104 and the bond fingers 102, each wire 106 connects one widen portion 102a of the bond finger 102 and another widen portion (i.e., the widen portion located at the other side) of the next bond finger 102. In this case, although each bond finger 102 is physically separate from one another, each bond finger 102 is electrically connected to its most adjacent bond finger(s) 102 and/or its most adjacent connection trace 104. Through such electrical connection arrangements of the wires and the bond fingers, the continuous coil is obtained.

Within the distribution region D of the bond fingers 102, a magnetic material block 108 is disposed over the package substrate 100, above the bond fingers 102 and below the wires 106. The magnetic material block 108 is located between the widen portions 102a and located right above the connecting portions 102b. Preferably, two adhesive layers 110 are respectively disposed on both opposite surfaces of the magnetic material block 108 to enhance the adhesion between the magnetic material block 108 and the bond fingers 102 or between the magnetic material block 108 and the wires 106. The material of the magnetic material block 108 can be a conductive material, such as nickel or ferrites, for example. The adhesive layer 110 can be a non-conductive epoxy layer or a non-conductive adhesive film, for example.

Figure 2A:
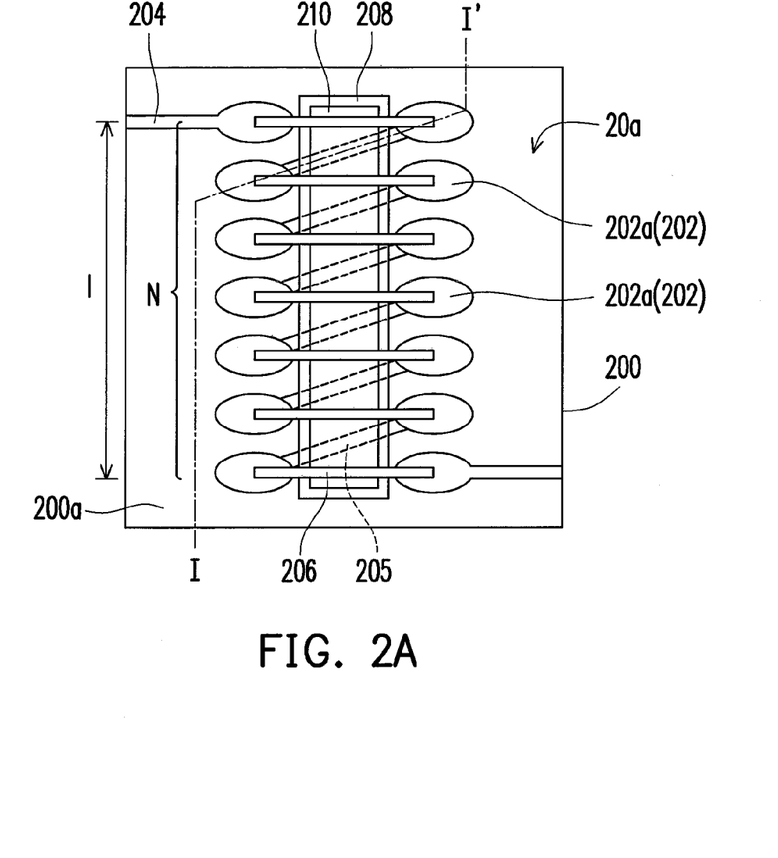
FIG. 2A is a schematic top view showing a power conductor structure according to the second embodiment of the present invention.
Figure 2B:
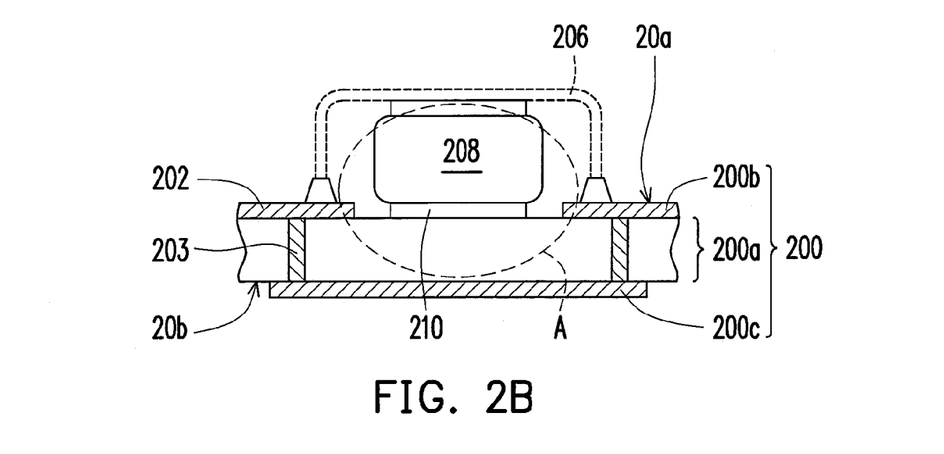
FIG. 2B is a schematic cross-sectional view showing the power conductor structure of FIG. 2A.
Figure 2C:
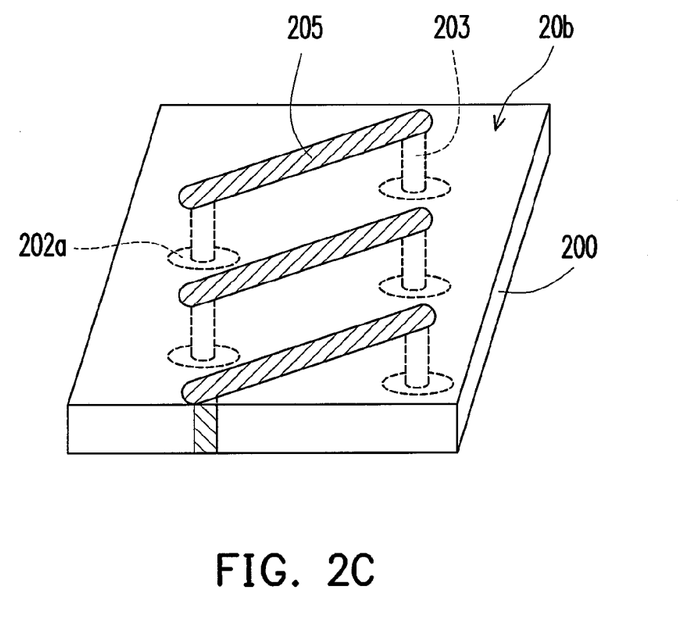
FIG. 2C is a schematic 3-D view showing a portion of the power conductor structure of FIG. 2A from the bottom surface.

FIG. 2A is a schematic top view showing a power conductor structure according to another embodiment of the present invention. FIG. 2B is a schematic cross-sectional view along line I-I' showing the power conductor structure of FIG. 2A. FIG. 2C is a schematic 3-D view showing a portion of the power conductor structure of FIG. 2A from the bottom surface.

In this embodiment, features similar to or the same as the above embodiment will not be described in details. In FIG. 2A, the package substrate 200 is a two-layered PCB having at least a top metal layer 200b and a bottom metal layer 200c respectively disposed on two opposites surfaces of the dielectric layer 200a. The top metal layer 200b of the package substrate 200 includes a plurality of bond finger pairs 202 on the top surface 20a, while the bottom metal layer 200c includes a plurality of conductive lines 205 on the bottom surface 20b. Alternatively, if the package substrate 200 is a four or more-layered PCB, the bottom metal layer can be any inner metal layer of the multiple layers of the PCB.

Different from the above embodiment, each bond finger pair 202 consists of two separate widen portions 202a located at two sides of the magnetic material block 208. Depending on the design requirements, the number of the bond finger pairs 202 is N, where N is a positive integer, larger than three. The shape of the widen portion 202a is not limited to the ellipse, but could be round, square, or any polygonal shape. As shown in FIG. 2C, the two separate widen portions 202a of each bond finger pair 202 are connected through conductive vias 203 inside the dielectric layer 200a and one conductive line 205 on the bottom surface 20b of the package substrate 200. The vias 203 and the conductive lines 205 are considered comparable to the connecting portions 102b connecting the two widen portions 102a in the above embodiment. In this embodiment, such arrangement may be more space economical and provide flexibility in design. Similarly, the shape and the arrangement of the bond finger pairs 202 are not limited by the examples provided herein and may be modified based on the considerations of compactness and electrical properties. In addition to the bond finger pairs 202, connection traces 204 can be arranged beside the most peripheral bond finger pairs 202 for electrical connection to external circuits or components.

As shown in FIGS. 2A-2B, a plurality of wires 206 are formed between the widen portions 202a of the bond finger pairs 202 as well as between the widen portions 202a and the connection traces 204. In FIG. 2A, the wire 206 is arranged across the magnetic material block 208 and connects one widen portion 202a of the bond finger pair 202 (i.e. at one side of the magnetic material block 208) and another widen portion 202a (i.e., the widen portion located at the other side of the magnetic material block 208) of the next bond finger pair 202. That is, the two separate widen portions 202a of the same finger pair 202 is electrically connected through the vias 203 and the conductive line 205 as shown in FIG. 2C, while each bond finger pair 202 is electrically connected to its most adjacent bond finger pair(s) 202 and/or its most adjacent connection trace 204 through the wires 206. Through such electrical connection arrangements of the wires, the embedded vias, the conductive lines and the bond finger pairs, a continuous coil is obtained. For the continuous coil, the number of the bond finger pairs 202 N is the number of the turns of the coil.

The magnetic material block 208 is disposed on the top surface 20a of the package substrate 200, between the two widen portions 202a of the bond finger pairs 202 and below the wires 206. Preferably, one adhesive layer 210 is respectively disposed on both opposite surfaces of the magnetic material block 208 to enhance the adhesion between the magnetic material block 208 and the substrate 200 or between the magnetic material block 208 and the wires 206.

Figure 3A:
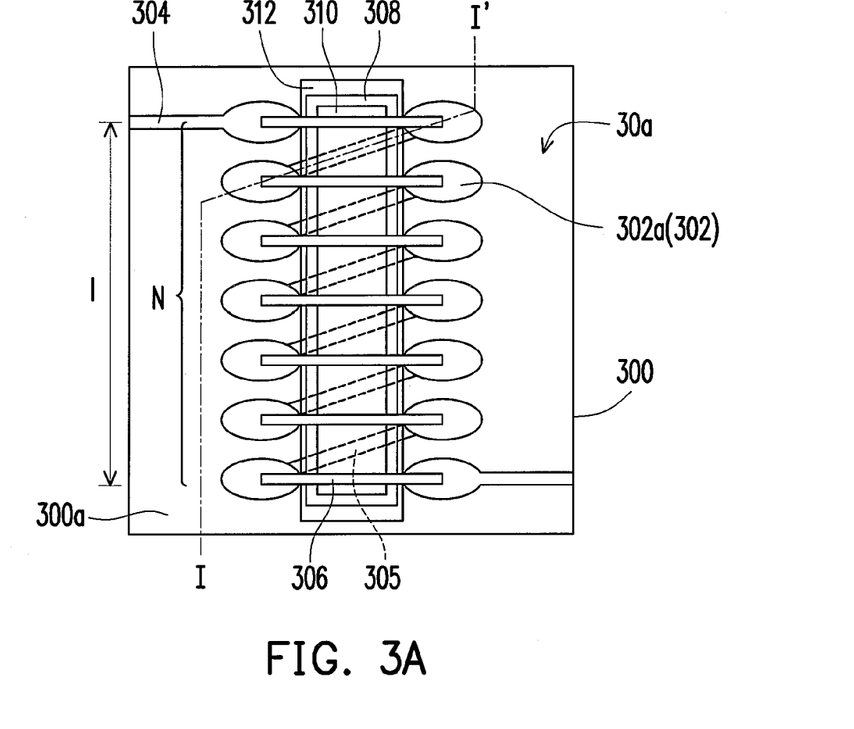
FIG. 3A is a schematic top view showing a power conductor structure according to the third embodiment of the present invention.
Figure 3B:
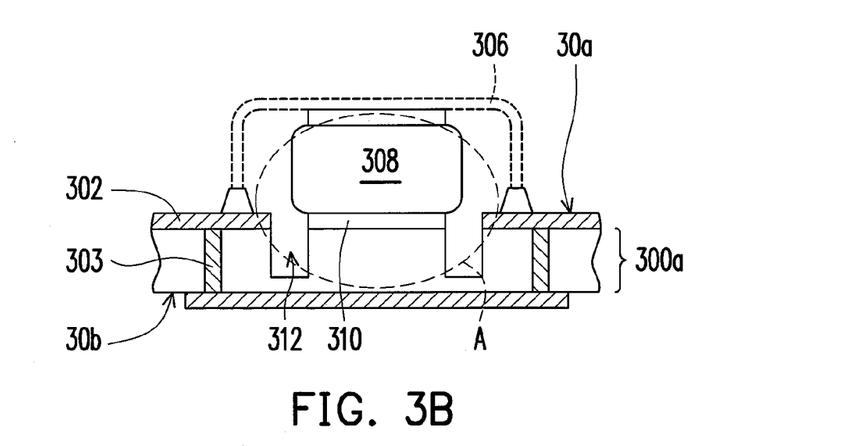
FIG. 3B is a schematic cross-sectional view showing the power conductor structure of FIG. 3A.

Alternatively, slots can be designed beside or surrounding the magnetic material block. As shown in FIGS. 3A-3B, a ring-shaped slot 312 is located within the dielectric layer 300a of the package substrate 300 and surrounding the magnetic material block 308. The slot 312 is built into the dielectric layer 300a as well as between the bond finger pairs 302 and the magnetic material block 308 without lowering the position of the magnetic material block 308, when compared with FIG. 2A. The slot 312 can be arranged along the four sides of the magnetic material block 308, or along any two opposite sides of the magnetic material block 308, for example. The depth or the shape of the slot 312 can be adjusted according to the electrical properties or layout requirements. The quality factor (Q) of an inductor is the ratio of its inductive reactance to its resistance at a given frequency, and is a measure of its efficiency. The design of the slot in the power inductor structure can offer high quality factor. Hence, the power inductor structure designed with the slot has high imaginary impedance due to low tangent loss involving replacing the dielectric material with air (i.e. the formation of the slot).

Moreover, in the following embodiment, trenches can be formed in the package substrate and the magnetic material block can be embedded more deeply, so as to either reduce the height of the package module or to provide larger magnetic core for the inductor structure.

Figure 4A:
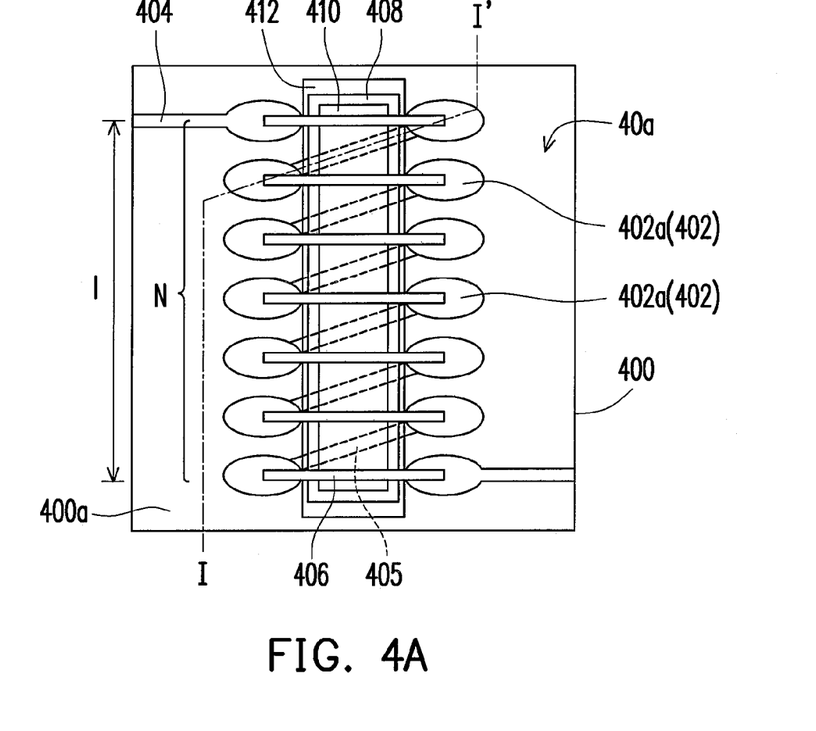
FIG. 4A is a schematic top view showing a power conductor structure according to the fourth embodiment of the present invention.
Figure 4B:
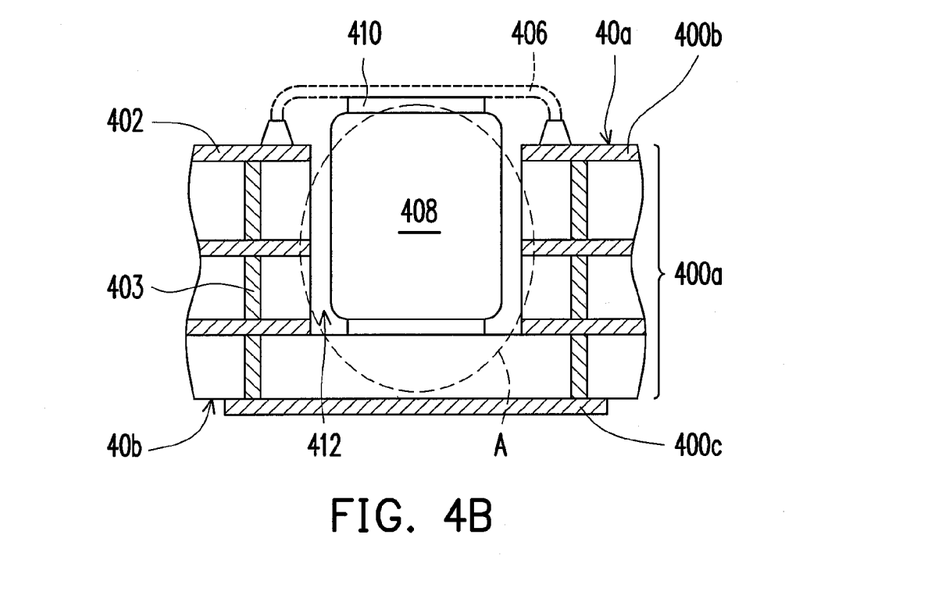
FIG. 4B is a schematic cross-sectional view showing the power conductor structure of FIG. 4A.

FIG. 4A is a schematic top view showing a power conductor structure according to another embodiment of the present invention. FIG. 4B is a schematic cross-sectional view along line I-I' showing the power conductor structure of FIG. 4A.

In FIG. 4A, the package substrate 400 is a four-layered PCB having at least a top metal layer 400b and a bottom metal layer 400c respectively disposed on two opposites surfaces of the dielectric core 400a. The dielectric core 400a may further include more metal layers or interconnecting structures therein. The top metal layer 400b of the package substrate 400 includes a plurality of bond finger pairs 402 on the top surface 40a, while the bottom metal layer 400c includes a plurality of conductive lines 405 on the bottom surface 40b. The dielectric core 400a includes a plurality of conductive vias 403 connecting the bond finger pairs 402 and the conductive lines 405. Similarly, each bond finger pair 402 consists of two separate widen portions 402a located at two sides of the magnetic material block 408, and the two separate widen portions 402a of each bond finger pair 402 are connected through conductive vias 403 inside the dielectric core 400a and one conductive line 405 on the bottom surface 40b of the package substrate 400. In addition to the bond finger pairs 402, connection traces 404 can be arranged beside the most peripheral bond finger pairs 402 for electrical connection to external circuits or components.

As shown in FIGS. 4A-4B, a plurality of wires 406 are formed over the magnetic material block 408, between the widen portions 402a of the bond finger pairs 402 as well as between the widen portions 402a and the connection traces 404.

Different from the above embodiment, a trench 412 is formed within the dielectric core 400a of the package substrate 400. The magnetic material block 408 is disposed within the trench 412, below the wires 406. Preferably, the magnetic material block 408 is partially protruded from the trench 412 and is higher than the top surface 40a of the package substrate 400. The size of the magnetic material block 408 can be varied, depending on the desirable module height or the required inductance. Accordingly, the depth of the trench 412 may be adjusted based on the thickness of the package substrate or the desirable module height. For example, when the magnetic material block of a larger size is applied, a deeper trench can be formed if a thinner package module is desirable. From the top view, the magnetic material block 408 is disposed between the widen portions 402a of the bond finger pairs 402. One adhesive layer 410 is respectively formed on both opposite surfaces of the magnetic material block 408 to enhance the adhesion between the magnetic material block 408 and the substrate 400 as well as between the magnetic material block 408 and the wires 406.

As embedded within the wiring board or the printed circuit board, either the height of the power inductor structure can be decreased or the power inductor structure can offer higher inductance values and/or endure higher currents.

For the exemplary inductor structure shown in FIGS. 1A-1B, through the electrical connections of the wires and the bond finger pairs, a continuous coil is obtained. Alternatively, for the exemplary inductor structures shown in FIGS. 2A-4B, a continuous coil is obtained through the electrical connections of the wires, the vias, the conductive lines and the bond finger pairs. The inductance of the exemplary inductor structures can be calculated according to the following equation:

$$L = \frac{N^2 \mu A}{l} [H]$$

where L represents inductance in henries (H) of the inductor structure, N represents the number of wire turns of the coil, μ represents the permeability of the core, l represents the length of the coil and A represents the cross-sectional area of the inductor structure (i.e. the area of core A as shown in FIG. 1B, 2B, 3B or 4B).

Clearly, the inductance of the inductor structure is proportional to the N (the number of wire turns of the coil), μ (the permeability of the core) and A (the cross-sectional area of the coil). Relatively, the inductor structure of FIG. 2B, 3B or 4B has a cross-sectional area of the coil larger than that of the inductor structure of FIG. 1B, because the cross-sectional area of the coil includes at least a part of the package substrate. In this case, the cross-sectional area of the coil A is increased and the inductance is increased accordingly. Similarly, for the layout design of the inductor structure of the present invention, it is acceptable to vary the number of wire turns of the coil N or the length of the coil l, in order to match suitable electrical properties. Alternatively, the permeability of the magnetic core μ can be modified by way of the design of the slot, for example.

Taking the exemplary inductor structure shown in FIGS. 1A-1B as an example, the inductance is about 2 μH, if the magnetic material is ferrite, the permeability of the magnetic core μ is 100 H·m$^{-1}$, N is 25, and l is 3.6 mm In fact, when compared with the conventional SMT power inductors, either the inductor structures of FIG. 2A-4B or the inductor structure of FIGS. 1A-1B can provide comparable satisfactory inductance (e.g. 0.4-5 μH), high current (e.g. 5-15 A) under the application frequency of 10 MHz or lower, as well as with smaller sizes.

In summary, the power inductor structures of the present invention can provide satisfactory inductance and afford smaller package sizes. Moreover, since there is no need to replace the commonly used package materials and the manufacturing processes are compatible with the present packaging processes, the fabrication costs can be lower.

Accordingly, the designs disclosed in the present invention are applicable for power inductor structures as DC to DC converters in package structures.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A power inductor structure, comprising:
a package substrate having a first metal layer and a second metal layer respectively disposed on a two opposite surfaces of the package substrate and a dielectirc core disposed between the first and second metal layers, wherein the first metal layer comprises a plurality of bond finger pairs, while the second metal layer comprises a plurality of conductive lines, each bond finger pair consists of two separate widen portions;
a plurality of conductive vias, located within the package substrate and connecting the widen portions of the bond finger pairs and the plurality of the conductive lines, wherein the two widen portions of each bond finger pair is electrically connected through the conductive vias and one conductive line;
a magnetic material block, located on the package substrate and between the widen portions, wherein the magnetic block is located on a top surface of the dielectric core and located above and surrounded by a ring-shaped slot concave into the dielectric core; and
a plurality of wires, located over the package substrate and across the magnetic material block, and electrically connecting the plurality of the bond finger pairs.

2. The power inductor structure as claimed in claim 1, further comprising a first adhesive layer disposed between the magnetic material block and the plurality of the wires and a second adhesive layer disposed between the magnetic material block and the package substrate.

3. The power inductor structure as claimed in claim 1, wherein the magnetic material block is disposed within a trench of the dielectric core.

4. The power inductor structure as claimed in claim 3, wherein the magnetic material block is protruded from the trench and is higher than a top surface of the package substrate.

5. The power inductor structure as claimed in claim 1, wherein a material of the magnetic material block includes nickel or a ferrite.

6. The power inductor structure as claimed in claim 2, wherein a material of the first or second adhesive layer includes a non-conductive epoxy resin.

7. The power inductor structure as claimed in claim 1, wherein the first metal layer further comprises at least two connection traces electrically connecting to the most peripheral bond finger pairs.

8. A power inductor, comprising:
a package substrate having a dielectric layer having a first surface and a second surface opposite to the first surface, a first metal layer disposed on the first surface of the dielectric layer, and a second metal layer disposed on the second surface of the dielectric layer, wherein the first metal layer comprises a plurality of bond finger pairs, while the second metal layer comprises a plurality of conductive lines, each bond finger pair consists of two separate widen portions;
a plurality of conductive vias, located within the dielectric layer and connecting the widen portions of the bond finger pairs and the plurality of the conductive lines, wherein the two widen portions of each bond finger pair is electrically connected through the conductive vias and one conductive line;
a magnetic material block, located on the first surface of the dielectric layer and between the widen portions, wherein an adhesive layer is disposed between the magnetic material block and the first surface of the dielectric layer;
a ring-shaped slot located within the dielectric layer and surrounding the magnetic material block; and
a plurality of wires, located over the package substrate and across the magnetic material block, and electrically connecting the plurality of the bond finger pairs.

9. The power inductor as claimed in claim 8, wherein the magnetic material block is disposed within a trench of the dielectric core.

10. The power inductor as claimed in claim 8, wherein the magnetic material block is protruded from the trench and is higher than the first surface of the dielectric layer.

11. The power inductor as claimed in claim 8, wherein a material of the magnetic material block includes a nickel or a ferrite.

12. The power inductor as claimed in claim 8, wherein a material of the adhesive layer includes a non-conductive epoxy resin.

13. The power inductor as claimed in claim 8, wherein the first metal layer further comprises at least two connection traces electrically connecting to the most peripheral bond finger pairs.

* * * * *